United States Patent [19]

Park et al.

[11] Patent Number: 5,599,465
[45] Date of Patent: Feb. 4, 1997

[54] METHOD FOR PRODUCING HIGH-TEMPERATURE SUPERCONDUCTING JOSEPHSON DEVICES

[75] Inventors: Chan H. Park; Jin P. Hong, both of Seoul, Rep. of Korea

[73] Assignee: Samsung Electro-Mechanics Co., Ltd., Rep. of Korea

[21] Appl. No.: 345,179

[22] Filed: Nov. 28, 1994

[30] Foreign Application Priority Data

Nov. 29, 1993 [KR] Rep. of Korea ............... 93-25721

[51] Int. Cl.$^6$ .............. B05D 5/12; H01L 39/22
[52] U.S. Cl. ............. 216/3; 216/49; 216/101; 216/108; 505/329; 505/410; 505/728
[58] Field of Search ............... 216/3, 101, 108, 216/49; 505/329, 410, 728

[56] References Cited

U.S. PATENT DOCUMENTS

| | | | |
|---|---|---|---|
| 4,106,975 | 8/1978 | Berkenblit et al. | 216/47 |
| 4,246,328 | 1/1981 | Sato et al. | 430/5 |
| 5,196,395 | 3/1993 | James et al. | 505/1 |
| 5,446,016 | 8/1995 | Tanaka et al. | 216/3 |

FOREIGN PATENT DOCUMENTS 0545816  6/1993  European Pat. Off. .

*Primary Examiner*—Lee C. Wright
*Attorney, Agent, or Firm*—Seidel, Gonda, Lavorgna & Monaco, P.C.

[57] ABSTRACT

A method is provided for producing superconducting Josephson devices using a chemical etching solution which comprises forming a mask on a predetermined portion of a MgO substrate, and immersing the MgO substrate having the mask in an aqueous acid solution in which the volume ratio of phosphoric acid to sulfuric acid is approximately 10:1 or more, so as to form a step at the boundary between the masked region and the unmasked region.

6 Claims, 4 Drawing Sheets ion beam etching and sputtering aceton treatment

YBCO thin film deposition

HMDS coating

P/R coating development chemical etching aceton treatment

YBCO thin film deposition

X 500

X 1000

X 1000

METHOD FOR PRODUCING HIGH-TEMPERATURE SUPERCONDUCTING JOSEPHSON DEVICES

BACKGROUND OF THE INVENTION

1. Field of the Invention

The present invention relates, in general, to methods for producing high-temperature superconducting Josephson devices and, more particularly, to methods for producing step-edge type high-temperature superconducting Josephson devices using a chemical etching solution of phosphoric acid and sulfuric acid to form substrate steps, without the use of ion milling and sputtering processes, thereby easily producing the devices and making a large area of etched substrate.

2. Description of the Prior Art

Ever since a high-temperature superconductor was found, various types of superconducting Josephson devices have been produced. However, high-temperature superconductor manufactures have significant difficulty in producing good quality junction devices because their crystallization temperature is higher and their coherence length is shorter than metal-based superconductors, and because there is crystal anisotropy. To avoid this difficulty, a bridge type Josephson junction using a crystallographic grain boundary of a YBCO ($YBaCuO_x$) thin film has been studied, but since it is virtually impossible to control the junction location, size and quality due to the properties of the material, this technique is not advantageous. Recently, all over the world, many attempts have been made to artificially manufacture weak link devices. There are three principal techniques: a step-edge process of forming the steps in a substrate to control the location at which a crystallographic grain boundary is formed, a bi-crystal process of making the crystal orientation be somewhat different, and a bi-epitaxial process of utilizing a buffer layer to rotate the crystal orientation at an angle of 45°.

Among the junctions described above, it is known that the step-edge junction is easily manufactured relative to the other junctions and therefore is being actively researched. This type of junction is shown in FIG. 1. As shown in this figure, sharp steps are formed on a usual substrate in such a way that the steps are angled by 45° or more relative to the surface of the substrate, followed by growth of an epitaxial YBCO thin film on the steps, so as to produce a crystallographic grain boundary at each of the step-edge portions.

At present, most researchers mainly use an ion-milling process or a sputtering process for the manufacture of the step-edge junction in a substrate. The disadvantages of these techniques are that the apparatus used are expensive and mass production and reproducibility are not readily attained. these are obstacles preventing the practical use of the these techniques.

To overcome these problems, U.S. Pat. No. 5,196,395 discloses that an oxide substrate is etched by a chemical etchant, to form V-steps for production of a high-temperature superconducting device. In more detail, a high-temperature superconducting thin film is coated over the V-steps manufactured by a chemical etchant, to produce a crystallographic grain boundary at each of the step portions, which is utilized as a Josephson junction. A formation process for a Josephson junction in this patent consists broadly of the following steps. First, V-steps are formed on a substrate by acid etching with a metal film serving as a mask. A high temperature superconductor (Tl type) is coated onto the V-steps and then a typical patterning process is used. However, as shown in FIG. 3A when the chemical etchant is made of phosphoric acid and sulfuric acid (4:1) as suggested in the supra patent, the surface condition of the substrate after etching is poor and thus there is a large possibility that a weak link might arise all over the substrate. In general, a substrate having a poor surface condition, e.g. many irregularities, is unsuitable for formation of a junction and it is virtually impossible to control the location of a junction and the junction properties with such a substrate. If a weak link is formed at an undesired position, the lithography cannot be carried out well, which is therefore a very serious problem. Consequently, it is fundamentally impossible to make a SQUID device using a weak link junction.

SUMMARY OF THE INVENTION

An object of the present invention, therefore, is to overcome the above problems encountered in prior art and to provide methods for the production of a high-temperature Josephson device, capable of making a large area of etched substrate with a smooth surface.

Based on the intensive research and study conducted by the present inventors, the above object can be accomplished by a providing a method for the production of a step-edge type high-temperature superconducting Josephson device wherein a chemical etchant is utilized. The method comprises forming a mask on a predetermined portion of a substrate, and immersing the substrate having the mask in an aqueous acid solution in which the volume ratio of phosphoric acid to sulfuric acid is on the order of approximately 10:1 or more. This forms a step at the boundary between the masked region and the unmasked region, whereby the surface of the substrate can be smooth.

Another aspect of the present invention also provides a method for the production of a step-edge type high-temperature superconducting Josephson device wherein a chemical etchant is utilized. This method comprises forming a P/R mask in a thickness of approximately 0.4 µm or less, whereby inclination of a step can become large.

Consequently, the present invention provides a technique using a chemical etchant, through which steps with a large etching angle can be precisely formed at the intended and correct positions.

BRIEF DESCRIPTION OF THE DRAWINGS

The above object and other advantages of the present invention will become more apparent by describing in detail the preferred embodiments of the present invention with reference to the attached drawings in which.

DETAILED DESCRIPTION OF THE INVENTION

A step-edge type junction device, as described above, is usually produced by forming sharp steps angled by 45° or more in a usual substrate and coating a YBCO thin film epitaxially on the steps to give a crystallographic grain boundary at each of the step-edge portions. In most cases, an ion milling process or a sputtering process is employed to manufacture the step-edge junction of the substrate. However, the apparatus for these processes are expensive. In addition, the processes are known to be problematic with regard to mass production and reproduciblity. Accordingly, it is very difficult to put these processes into practical use.

The present invention overcomes these problems to produce step-edge type Josephson devices, without using an ion-milling process or a sputtering process, which are important in forming the step of a substrate in step-edge type junction devices. In the present invention, a chemical etchant consisting of phosphoric acid and sulfuric acid is used to form the steps on a substrate.

The present inventors have intensively researched and studied the fundamental factors for formation of junctions, such as inclination of the step resulting for the use of a chemical etchant to form the steps of a substrate, as well as the characteristics of devices using step-edges. Accordingly, the present invention is applicable to all devices utilizing the Josephson effect, especially, step-edge type Josephson junction devices, such as direct current-superconducting quantum interference devices (DC-SQUID), that is, micro magnetic field detecting devices, and detectors using microwave and millimeter wave.

The application of the preferred embodiments of the present invention is best understood with reference to the accompanying drawings.

Figure 1:
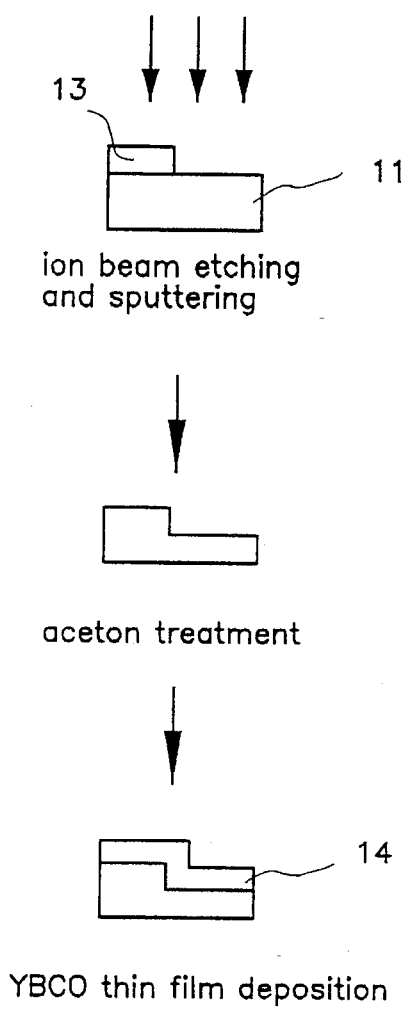
FIG. 1 is a schematic view illustrating a conventional process for producing a high-temperature superconducting Josephson device.
Figure 2:
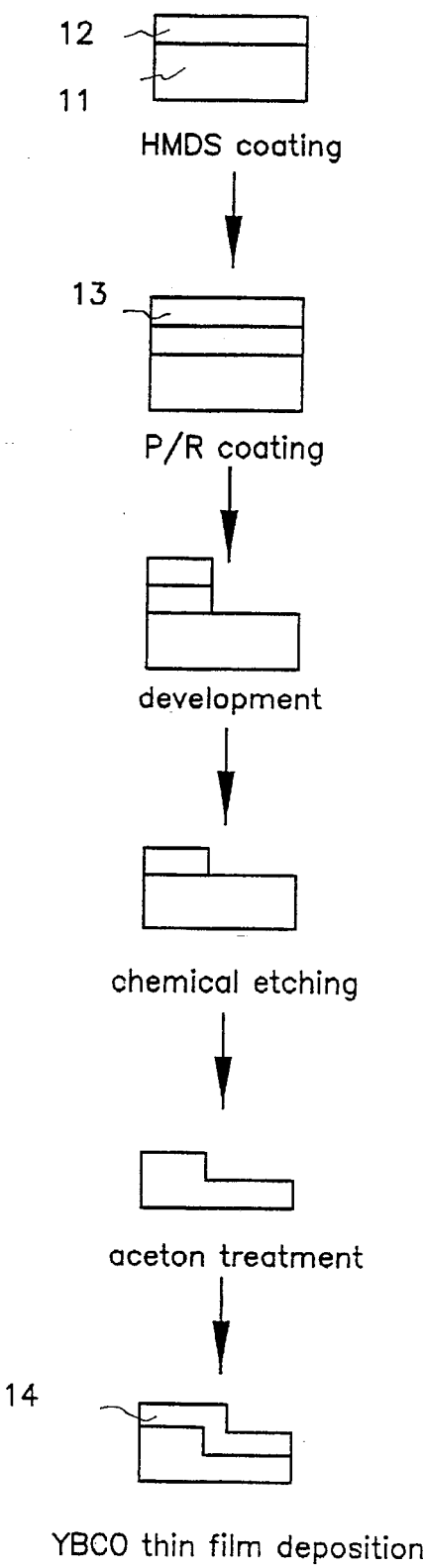
FIG. 2 is a schematic view illustrating a process for producing a high-temperature superconducting Josephson device, according to the present invention.

FIG. 2 shows a method for producing high-temperature superconducting Josephson devices, according to the present invention, wherein a YBCO type high temperature superconducting thin film is utilized.

First, as shown in this figure, a substrate 11 is etched to form a step. MgO monocrystalline substrate, which is suitable for high frequency is usually used as the substrate 11. For etching, the substrate 11 is initially coated with hexamethyldisilazane (hereinafter referred to as "HMDS") 12, using a spin coater. Next, a photoresist (hereinafter referred to as "P/R") mask 13 is manufactured using a standard photolithographic process and exposed to UV, to develop the P/R mask 13. Coating of HMDS onto the MgO substrate improves the adhesion between the substrate and the P/R mask.

Subsequently, the MgO substrate 11 is immersed in an aqueous acid solution consisting of phosphoric acid and sulfuric acid, to etch half of the MgO substrate and then, treated with acetone to take off the remaining P/R. In the aqueous acid solution, used as the etchant, the volume ratio of phosphoric acid to sulfuric acid is at least 10:1, preferably on the order of 10:1 to 30:1 and more preferably on the order of 10:1 to 20:1.

Meanwhile, the angle of the step is required to be as large as possible, in order to form a weak link. Reproducible, high-temperature superconducting Josephson devices are virtually impossible to make with the usual chemical etching processes because the step has a gradual inclination.

The problem can be solved in the present invention by making the etching mask thin. As a result of extensive experiments, the present inventors found that an etching angle of not less than 30° was formed reproducibly when the P/R etching mask was approximately 0.4 μm or less. Also, it was found that, when the thickness of the P/R etching mask was 0.28 μm, angles of 45° or more, enough to form a weak link, could be formed.

However, when the thickness of the P/R mask is below 0.25 μm, it is too thin to serve as an etching film. Accordingly, the thickness of the P/R mask is preferably on the order of approximately 0.25 to approximately 0.4 μm and more preferably on the order of approximately 0.25 to approximately 0.30 μm.

Consequently, the present invention pertains to controlling the etching angle with the thickness of the etching mask, regardless of the type of the mask thereof.

Prior to sputtering, the MgO substrate, in which the step is formed by the chemical etchant, is subjected to thermal treatment at a temperature of 900° to 1,100° C. for 2 hours in an oxygen atmosphere. Using off-axis RF magnetron sputtering, a YBCO thin film 14 is deposited over the MgO substrate in-situ.

Following deposition of the YBCO superconducting thin film 14 with a thickness of approximately 2,500 to approximately 3,000 Å, a photolithographic process is used to form a desired pattern which is treated with an aqueous phosphoric acid solution. For this operation, care must be taken so as not to break fine portions, such as microbridges, by the undercutting effect.

As emphasized above, the method according to the present invention is characterized by forming a P/R mask on all of the surface of a substrate except where the step is to be formed, in a thickness of approximately 0.4 μm or less, and immersing the substrate having the P/R mask in an aqueous acid solution in which the volume ratio of phosphoric acid to sulfuric acid is on the order of approximately 10:1 or more, thereby making the surface of the substrate smooth and the inclination of the step large.

The preferred embodiments of the present invention will now be further described with reference to specific examples.

EXAMPLE 1

A predetermined portion of a MgO monocrystalline substrate (100) was etched to form a step. HMDS was coated onto the substrate by a spin coater. A P/R mask with a thickness of 0.28 μm, was formed onto the HMDS using a standard photolithographic process. Then, the P/R mask was exposed to UV, to develop the P/R mask.

When acid was used to etch the MgO substrate, the step had a gradual inclination of the step became gradual and thus, it was difficult to form a Josephson junction. For this reason, the exposure conditions, development conditions and thickness of the P/R (Shipery AZ-1350J) were controlled as shown in Table 1.

TABLE 1

| Exposure and Development Conditions for P/R | |
| --- | --- |
| Exposure Time | 10 sec. |
| Development Time | 20 sec. |

TABLE 1-continued

| Exposure and Development Conditions for P/R | |
|---|---|
| Pre-Baking | 90° C., 30 min. |
| Post-Baking | 110° C., 60 min. |

The MgO substrate was then immersed in an aqueous acid solution containing 20 ml of phosphoric acid and 1 ml of sulfuric acid, to etch half of the MgO substrate. It was then, treated with acetone, to take off the remaining P/R. Prior to sputtering, the MgO substrate, in which the step was formed by the chemical etchant, was subjected to thermal treatment at approximately 1,100° C. for 2 hours in an oxygen atmosphere. Using off-axis RF magnetron sputtering, a 2,500 Å YBCO thin film 14 was deposited over the MgO substrate in-situ. Following this, a photolithographic process was used to form a desired pattern which was treated with a 6% aqueous phosphoric acid solution.

Conditions for the formation of the YBCO thin film are listed in Table 2.

TABLE 2

| Conditions for forming YBCO thin film | |
|---|---|
| Target Composition | Y:Ba:Cu = 1:2:3 |
| Substrate | MgO (100) |
| Substrate Temp. | 700° C. |
| Sputtering Gas | Ar:O$_2$ = 3:1 |
| Sputtering Pressure | 200 mTorr |
| Power | 110 W |

In this Example, a bridge was obtained which was approximately 5 μm wide.

Figure 4A:
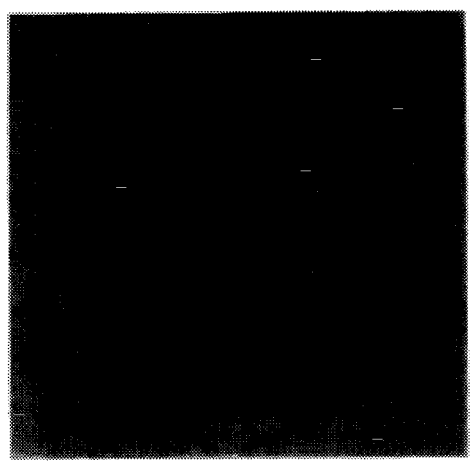
FIGS. 4A through 4C are optical, microscopic photographs of step-edge structures in which P/R masks are used with a thickness of 1.8 µm, 1.0 µm and 0.28 µm, respectively.
Figure 4B:
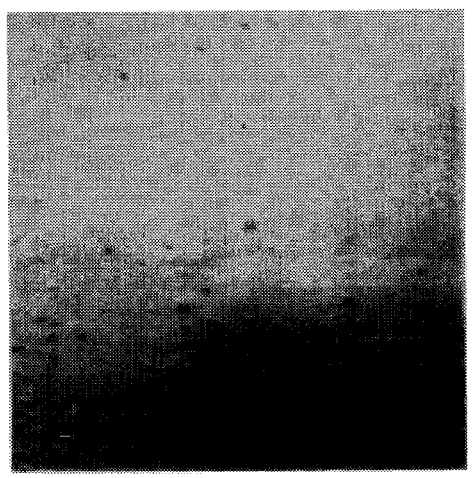
Figure 4C:
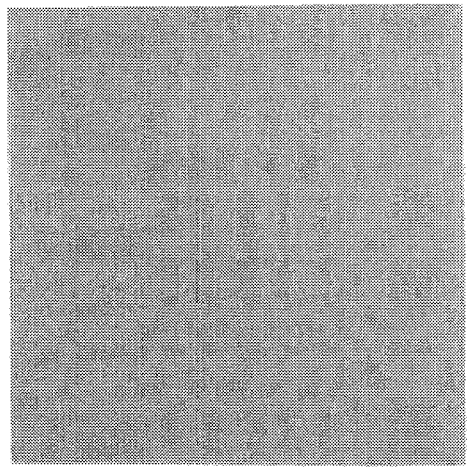
Figure 5:
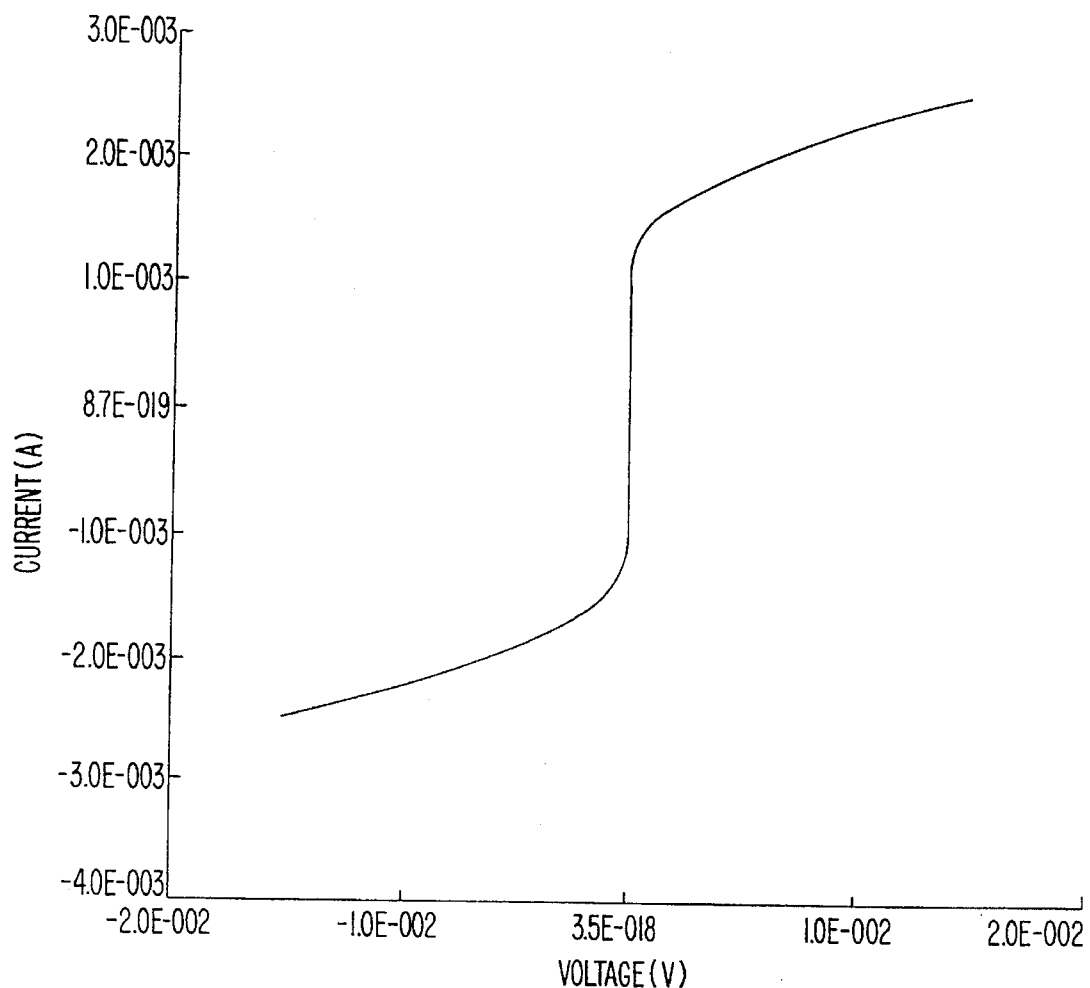
FIG. 5 is a graph showing current-voltage characteristics of a step-edge type Josephson device according to the present invention.

FIGS. 3 through 5, illustrate characteristics of step-edge type Josephson junction devices.

Figure 3A:
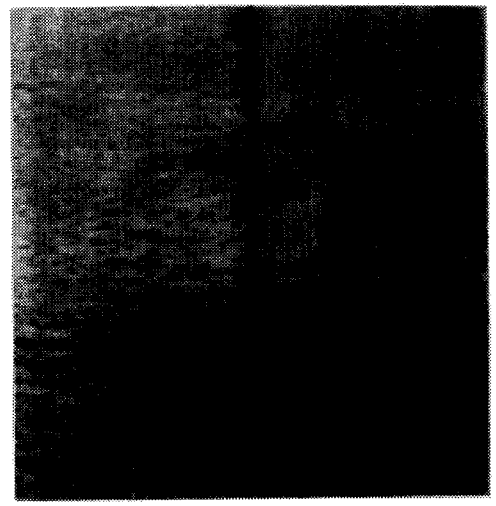
FIGS. 3A through 3C are optical, microscopic photographs of step-edge structure in which chemical etchants consisting of phosphoric acid and sulfuric acid are used with the volume ratios of the phosphoric acid to sulfuric acid being 4:1, 10:1 and 20:1, respectively.
Figure 3B:
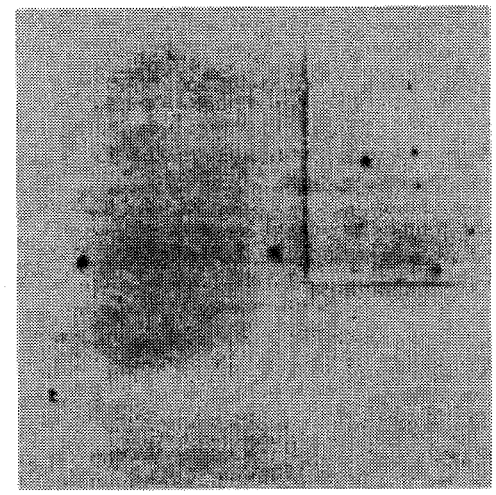
Figure 3C:
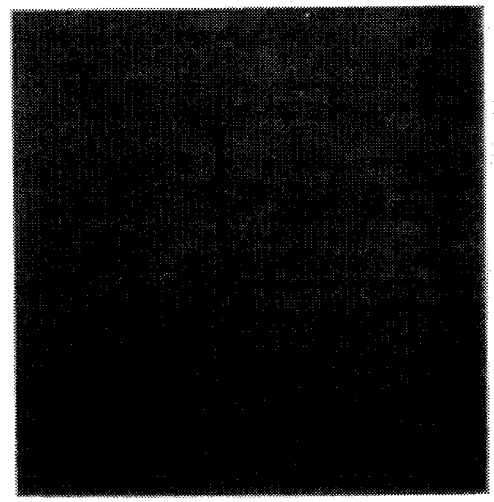

FIGS. 3A through 3C are three optical microscopic photographs of step-edge structures which are formed by etching a P/R mask having a thickness of 0.28 μm with aqueous acid solutions in which the volume ratios of phosphoric acid to sulfuric acid are 4:1, 10:1 and 20:1, respectively. As shown in these figures, the chemical etchants with phosphoric acid:sulfuric acid ratios of 10:1 and 20:1 are even more effective in giving a smooth surface to step-edge structure than conventional one with phosphoric acid:sulfuric acid ratio of 4:1.

FIGS. 4A through 4C show three step-edge type structures which are formed by etching P/R masks having a thickness of 1.8 μm, 1 μm and 0.28 μm, respectively, with a chemical etchant containing phosphoric acid and sulfuric acid in a volume ratio of 4:1. As shown in these figures, the step-edge of the substrate with the P/R mask with a thickness of 0.28 μm has a larger inclination than those with a thickness of 1.8 and 1 μm.

FIG. 5 is a graph showing current-voltage characteristics of a step-edge type Josephson device of the present invention at T=12.5K. As apparent from $I_C$ and $J_C$ in this graph, a weak link is accomplished.

As explained above, the method according to the present invention, which is characterized by using the chemical etchant instead of ion milling or sputtering, and employing a P/R mask with a thickness of 0.4 μm or less, proves effective in production of Josephson devices and is advantageous in etching large areas in an integrated circuit.

Other features, advantages and embodiments of the invention disclosed herein will be readily apparent to those exercising ordinary skill after reading the foregoing disclosures. In this regard, while specific embodiments of the invention have been described in considerable detail, variations and modifications of these embodiments can be effected without departing from the spirit and scope of the invention as described and claimed.

What is claimed is:

1. A method for the production of a step-edge superconducting Josephson device wherein a chemical etchant is utilized, comprising:

forming a mask on a predetermined portion of a MgO substrate; and immersing the MgO substrate having the mask in an aqueous acid solution in which the volume ratio of phosphoric acid to sulfuric acid is approximately 10:1 or more, so as to form a step at the boundary between the masked region and the unmasked region.

2. A method in accordance with claim 1, wherein the volume ratio of phosphoric acid to sulfuric acid is approximately 10:1 to 30:1.

3. A method in accordance with claim 2, wherein the volume ratio of phosphoric acid to sulfuric acid is approximately 10:1 to 20:1.

4. A method in accordance with claim 1, wherein said mask is made of photoresist.

5. A method in accordance with claim 4 wherein the thickness of the photoresist mask is approximately 0.4 μm or less.

6. A method in accordance with claim 5, wherein the thickness of the photoresist mask is approximately 0.25 to 0.30 μm.

\* \* \* \* \*